(12) United States Patent
Sawase et al.

(10) Patent No.: US 7,199,412 B2
(45) Date of Patent: Apr. 3, 2007

(54) IMAGE SENSOR WITH SURFACE REGIONS OF DIFFERENT DOPING

(75) Inventors: Kensuke Sawase, Kyoto (JP); Yuji Matsumoto, Kyoto (JP); Kiyotaka Sawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/878,109

(22) Filed: Jun. 29, 2004

(65) Prior Publication Data

US 2005/0012167 A1    Jan. 20, 2005

(30) Foreign Application Priority Data

Jul. 16, 2003  (JP)  ............... 2003-197965

(51) Int. Cl.
*H01L 31/06* (2006.01)
*H01L 31/062* (2006.01)
*H01L 31/113* (2006.01)

(52) U.S. Cl. ............... 257/292; 257/461; 257/463; 257/E31.003; 257/E31.032

(58) Field of Classification Search ............... 257/233, 257/292, 461, 463, 464, 465, E31.003, E31.032
See application file for complete search history.

(56) References Cited

U.S. PATENT DOCUMENTS

| | | | |
|---|---|---|---|
| 6,404,029 B1 | 6/2002 | Hosokawa et al. | |
| 6,590,242 B1 | 7/2003 | Kozuka et al. | |
| 6,632,701 B2* | 10/2003 | Merrill | 438/70 |
| 6,956,273 B2* | 10/2005 | Koizumi | 257/440 |
| 2001/0038096 A1 | 11/2001 | Fukushima et al. | |
| 2003/0030083 A1* | 2/2003 | Lee et al. | 257/292 |
| 2003/0057431 A1 | 3/2003 | Kozuka et al. | |
| 2003/0098454 A1* | 5/2003 | Maeda et al. | 257/22 |
| 2003/0193586 A1* | 10/2003 | Hayakawa | 348/272 |
| 2004/0046193 A1* | 3/2004 | Park et al. | 257/292 |
| 2004/0046194 A1 | 3/2004 | Kozuka et al. | |
| 2004/0188727 A1* | 9/2004 | Patrick | 257/292 |

FOREIGN PATENT DOCUMENTS

| | | |
|---|---|---|
| JP | 62-131566 | 6/1987 |
| JP | 01-216581 | 8/1989 |
| JP | 05-243549 | 9/1993 |
| JP | 11-068077 | 3/1999 |
| JP | 2000-312024 | 11/2000 |
| JP | 2001-77401 | 3/2001 |
| JP | 2001-284629 | 10/2001 |

* cited by examiner

*Primary Examiner*—Ngân V. Ngô
(74) *Attorney, Agent, or Firm*—Rabin & Berdo, PC

(57) ABSTRACT

A production method for an image sensor which is provided with a plurality of sensor portions arranged on a semiconductor substrate and each having a first photodiode constituted by a first region of a first conductivity type and a second region of a second conductivity type different from the first conductivity type and a second photodiode constituted by the second region and a third region of the first conductivity type. The method includes the steps of: forming a second region of the second conductivity type on a first region defined in a semiconductor substrate by epitaxial growth; and forming a third region of the first conductivity type on the second region by epitaxial growth.

10 Claims, 2 Drawing Sheets

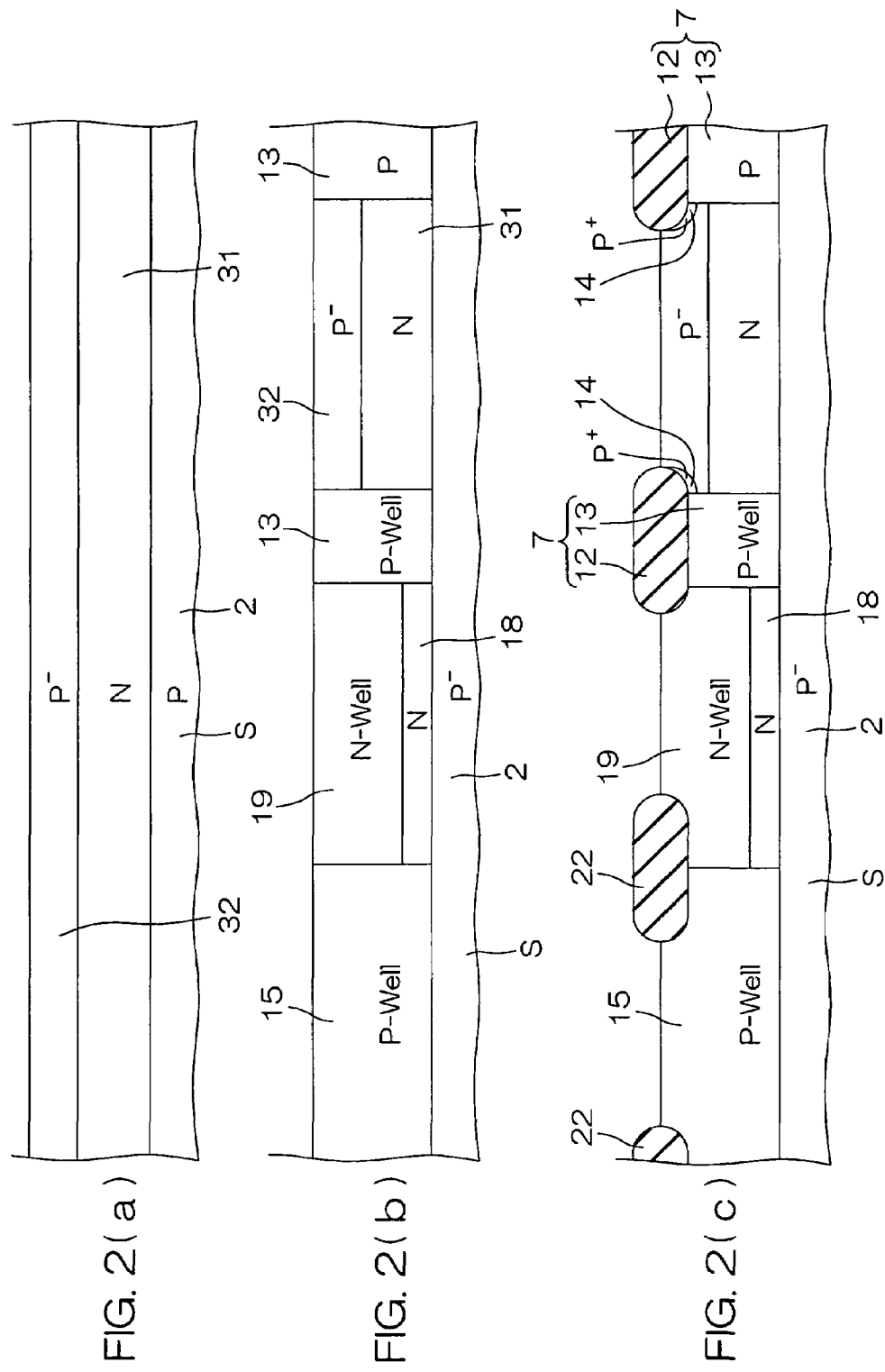

IMAGE SENSOR WITH SURFACE REGIONS OF DIFFERENT DOPING

BACKGROUND OF THE INVENTION

1. Field of the Invention

The present invention relates to an image sensor which includes a plurality of sensor portions each including a photodiode, and to a production method for the image sensor.

2. Description of Related Art

Image sensors typically include a plurality of sensor portions each including a photodiode, and are capable of determining a light amount distribution with respect to the arrangement of the sensor portions. Such a photodiode is conventionally produced, for example, by implanting and diffusing a P-type impurity into a surface portion of an N-type first region defined in a semiconductor substrate to form a P-type second region. Thus, a first photodiode is provided, which includes the N-type first region and the P-type second region provided on the first region (see, for example, Japanese Unexamined Patent Publication No. 2000-312024).

Further, an N-type third region is optionally formed on the second region. In this case, a second photodiode constituted by the second region and the third region is provided in addition to the first photodiode. With this arrangement, the second region can easily be depleted by applying a reverse bias voltage to the first and second photodiodes.

When the second region is completely depleted, the photodiodes each generate maximum photovoltaic power (photoelectric current) for a predetermined light amount, and have a minimum capacitance.

The formation of the third region is achieved by diffusing an N-type impurity into a region including the second region.

In order to completely deplete the second region, the second region and the third region should each be formed as having a predetermined impurity concentration profile (as having a predetermined thickness and a predetermined impurity concentration). However, it is difficult to precisely control the impurity concentration profile by the diffusion of the impurity.

SUMMARY OF THE INVENTION

It is an object of the present invention to provide an image sensor production method in which the impurity concentration profile of a semiconductor portion can easily be controlled.

It is another object of the present invention to provide an image sensor which is produced by controlling the impurity concentration profile of a semiconductor portion thereof.

According to a first aspect of the present invention, there is provided a production method for an image sensor which comprises a plurality of sensor portions arranged on a semiconductor substrate and each having a first photodiode constituted by a first region of a first conductivity type and a second region of a second conductivity type different from the first conductivity type and a second photodiode constituted by the second region and a third region of the first conductivity type. The method comprises the steps of: forming the second regions of the second conductivity type on a first region defined in a semiconductor substrate by epitaxial growth; and forming the third regions of the first conductivity type on the second regions by epitaxial growth.

According to this inventive aspect, the second region and the third region are formed by the epitaxial growth. Since the epitaxial growth allows for easy control of an impurity concentration in forming a semiconductor layer, the impurity concentrations of the second and third regions can each precisely be controlled at a predetermined level. Further, the second and third regions are each allowed to have an exactly predetermined thickness by the epitaxial growth. That is, this image sensor production method can easily control the impurity concentration profiles of the second and third regions.

Since the impurity concentration profiles of the second and third regions are properly controlled, the second region can completely be depleted when a predetermined reverse bias voltage is applied to the first and second photodiodes (to a PN junction between the first region and the second region and to a PN junction between the second region and the third region). In this case, the first and second photodiodes each generate maximum photovoltaic power (photoelectric current) for a predetermined light amount, and each have a minimum capacitance. That is, the sensor portions each have a higher sensitivity.

The first region maybe the semiconductor substrate per se. Alternatively, the first region may be a buried layer which is formed by forming an epitaxial layer on the semiconductor substrate containing an impurity of the first conductivity type implanted into a predetermined region thereof, and then thermally diffusing the impurity into the semiconductor substrate and the epitaxial layer.

The second region forming step may include the step of forming a first epitaxial layer of the second conductivity type on an area of the first region including a second region formation area corresponding to the second region, and the third region forming step may include the step of forming a second epitaxial layer of the first conductivity type on an area of the first epitaxial layer including a third region formation area corresponding to the third region. In this case, the image sensor production method may further comprise the step of introducing an impurity of the first conductivity type in a predetermined region extending from the first epitaxial layer to the second epitaxial layer to form a well layer of the first conductivity type having a higher impurity concentration than the third region, whereby the first epitaxial layer is divided into the plurality of the second regions by the well layer and the second epitaxial layer is divided into the plurality of the third regions by the well layer.

With this arrangement, the plurality of sensor portions can be formed on the semiconductor substrate with second and third regions thereof isolated from adjacent second and third regions by the well layer.

Here, the second regions are each surrounded by the first region and the well layer having a different conductivity type from that of the second regions, so that the sensor portions are electrically isolated from each other by PN junctions. Therefore, a leak electric current occurring between adjacent sensor portions can be reduced. Thus, photoelectric currents caused by photovoltaic power generated in the respective sensor portions can independently be taken out, so that the amounts of light received by the respective sensor portions can accurately be determined.

The image sensor production method may further comprise the step of selectively oxidizing a surface of the well layer and its periphery for formation of an isolation region after the well layer forming step. Thus, at least surfaces of the adjacent second regions are isolated from each other by the isolation region in the resulting image sensor. Since the isolation region is formed in addition to the well layer, the leak electric current occurring between the adjacent sensor portions can further be reduced. Where the semiconductor portions are composed of silicon, the formation of the isolation region may be achieved, for example, by a LOCOS (localized oxidation of silicon) technique. The formation of the isolation region may be achieved by STI (shallow trench isolation) and/or DTI (deep trench isolation) technique.

The image sensor production method may further comprise the step of forming a functional device in the semiconductor substrate. Thus, the sensor portions and the functional device are provided on the single semiconductor substrate in the resulting image sensor. The functional device formed in the semiconductor substrate may include, for example, an N-channel MOS and a P-channel MOS. That is, the image sensor production method may comprise the step of forming a CMOS (complementary metal oxide semiconductor) structure in the semiconductor substrate.

The image sensor production method may further comprise the step of introducing an impurity of the first conductivity type into a surface portion of the third region to form a fourth region of the first conductivity type which has a higher impurity concentration than the other portion of the third region.

With this arrangement, the fourth region is formed as a portion of the third region in the surface portion of the third region. The fourth region has a higher impurity concentration than the other portion of the third region. Therefore, a depletion layer is prevented from spreading to the surface of the fourth region even if the reverse bias voltage is applied to the second photodiode. Even if the surface portion of the second epitaxial layer (third region) has defects, electric current leak due to the defects can be prevented.

According to another aspect of the present invention, there is provided an image sensor comprising a plurality of sensor portions arranged on a semiconductor substrate, the sensor portions each comprising: a first region of a first conductivity type defined in the semiconductor substrate; a second region of a second conductivity type formed on the first region by epitaxial growth, the second conductivity type being different from the first conductivity type; and a third region of the first conductivity type formed on the second region by epitaxial growth, the sensor portions each having a first photodiode constituted by the first region and the second region and a second photodiode constituted by the second region and the third region.

The image sensor may comprise a well layer of the first conductivity type having a higher impurity concentration than the third region and disposed between the second and third regions of each adjacent pair of the sensor portions.

The image sensor may further comprise an isolation region of an oxide provided on the well layer. In this case, the isolation region preferably has a greater width than the well layer. The image sensor may further comprise a functional device provided in the semiconductor substrate. The functional device may comprise, for example, an N-channel MOS and a P-channel MOS. That is, the semiconductor substrate may be formed with a CMOS structure.

The image sensor may further comprise a fourth region of the first conductivity type provided in a surface portion of the third region and having a higher impurity concentration than the other portion of the third region.

The image sensor may further comprise a power source for applying a reverse bias voltage to the first and second photodiodes.

With this arrangement, the second region can virtually completely be depleted by applying the reverse bias voltage to the first and second photodiodes (to a PN junction between the first and second regions and to a PN junction between the second and third regions).

The foregoing and other objects, features and effects of the present invention will become more apparent from the following description of the preferred embodiments with reference to the attached drawings.

BRIEF DESCRIPTION OF THE DRAWINGS

FIGS. 2(a), 2(b) and 2(c) are schematic sectional views for explaining a production method for the image sensor shown in FIG. 1.

DESCRIPTION OF THE PREFERRED EMBODIMENTS

Figure 1:
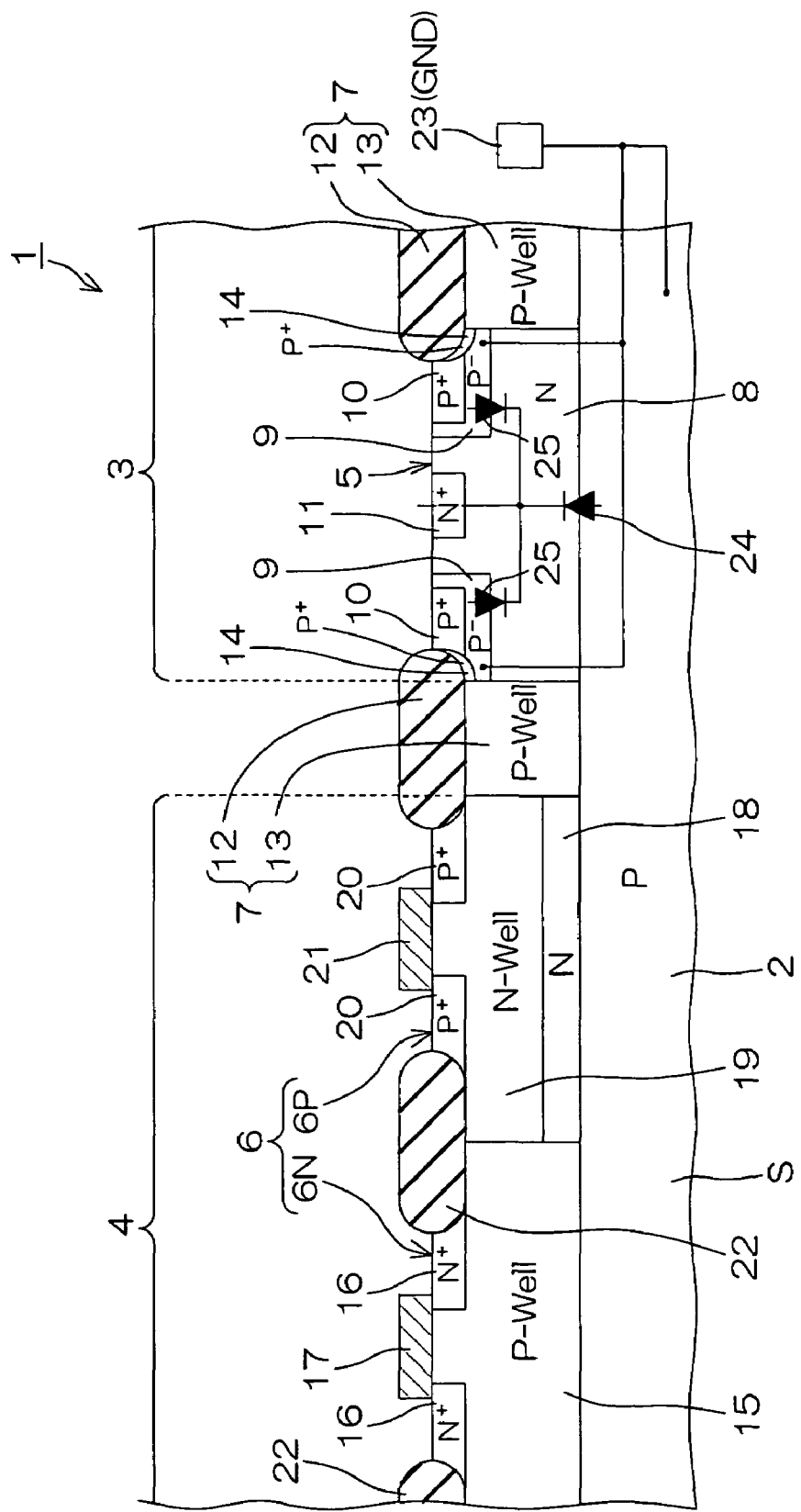
FIG. 1 is a schematic sectional view illustrating the construction of an image sensor according to one embodiment of the present invention.

FIG. 1 is a schematic sectional view illustrating the construction of an image sensor according to one embodiment of the present invention.

The image sensor 1 includes a P-type first region 2 defined in a silicon substrate S, and a sensor portion formation region 3 and a functional device formation region 4 provided on the first region 2. The first region 2 may be a silicon substrate S per se containing an impurity introduced for controlling the P-type conductivity.

A plurality of sensor portions 5 each adapted to generate photovoltaic power when receiving light (only one sensor portion 5 is shown in FIG. 1) are arranged in the sensor portion formation region 3 along the surface of the silicon substrate S. The sensor portions 5 are each adapted to generate the photovoltaic power according to the amount of the received light. Therefore, a light amount distribution with respect to the arrangement of the sensor portions 5 can be determined by measuring photoelectric currents caused by the photovoltaic power generated in the respective sensor portions 5.

A functional device including an N-channel MOS 6N and a P-channel MOS 6P is provided in the functional device formation region 4. That is, the image sensor 1 includes a CMOS 6 constituted by the N-channel MOS 6N and the P-channel MOS 6P. An isolation portion 7 is provided between the sensor portion formation region 3 and the functional device formation region 4 (the P-channel MOS 6P of the CMOS 6). The sensor portion formation region 3 and the functional device formation region 4 are electrically isolated from each other by the isolation portion 7.

The isolation portion 7 includes a LOCOS (localized oxidation of silicon) isolation region 12 provided in the surface of the image sensor 1, and a P-type well layer 13 provided between the first region 2 and the isolation region 12. The well layer 13 has a smaller width than the isolation region 12, for example, a width of about 9 μm.

Since the sensor portions 5 and the CMOS 6 are provided on the single silicon substrate S, the generation of the photoelectric currents by the respective sensor portions 5 and the signal processing by the CMOS 6 are carried out on the single silicon substrate S.

The sensor portions 5 each include an N-type second region 8 formed on the silicon substrate S by epitaxial growth, and a third region 9 having P$^-$-type and P$^+$-type regions formed on the second region 8 by epitaxial growth. That is, the sensor portions 5 each include two layers of different conductivity types formed by the epitaxial growth.

The second region 8 has an impurity concentration, for example, of not higher than $3 \times 10^{15}$ cm$^{-3}$ (e.g., from $7 \times 10^{14}$ cm$^{-3}$ to $3 \times 10^{15}$ cm$^{-3}$).

The third region 9 is present in a sensor surface of the sensor portion 5 except a center surface portion. FIG. 1 shows that the sensor surface may include surface portions of rregions 8, 9, and 10. A P$^+$-type fourth region 10 is provided in a surface portion of the third region 9, and the other portion of the third region 9 is of a P$^-$ type.

Thus, the sensor portion formation region 3 has a four layer structure including the N-type second region 8 formed by the epitaxial growth, the P-type third region 9 (excluding the fourth region 10) formed by the epitaxial growth, and the P$^+$-type fourth region 10, which are disposed in this order on the P-type silicon substrate S.

Further, an N$^+$-type fifth region 11 is provided in the center surface portion of the sensor portion 5. The second region 8 is partly interposed between the third region 9 and the fifth region 11.

Another isolation portion 7 is provided between each adjacent pair of the sensor portions 5. This isolation portion 7 has substantially the same structure as the isolation portion 7 provided between the sensor portion formation region 3 and the functional device formation region 4. That is, this isolation portion 7 includes a well layer 13 disposed between the second and third regions 8, 9 of the adjacent sensor portions 5 and 5, and a LOCOS isolation region 12 disposed on the well layer 13.

The well layer 13 has a higher impurity concentration than the portion of the third region 9 excluding the fourth region 10. The isolation region 12 is present between the third regions 9 of the adjacent sensor portions 5 and 5 to isolate the surface portions of the third regions 9 from each other.

The second region 8 is surrounded by the first region 2 and the well layer 13 each having the conductivity type different from that of the second region 8. Therefore, the sensor portions 5 are each electrically isolated by a PN junction. Since the isolation region 12 is provided in addition to the well layer 13, a leak electric current occurring between the adjacent sensor portions 5 is reduced. Thus, the image sensor 1 can independently take out electric currents generated in the respective sensor portions 5, so that the amounts of light received by the respective sensor portions 5 can accurately be determined.

The sensor portions 5 each include a first photodiode 24 constituted by the first region 2 and the second region 8. The sensor portions 5 each further include a second photodiode 25 constituted by the second region 8 and the third region 9. The first region 2 is not divided by the isolation portion 7 and, therefore, shared by the plurality of sensor portions 5. The fifth region 11 functions as a cathode take-out region for the first and second photodiodes 24, 25.

A P$^+$-type high concentration region 14 having a higher impurity concentration than the portion of the third region 9 excluding the fourth region 10 is provided adjacent the well layer 13 below the isolation region 12 (on the side of the first region 2) in the sensor portion formation region 3. The high concentration region 14 contacts the third region 9 (the fourth region 10). A region adjacent to the isolation region 12 is liable to have defects introduced therein by the formation of the isolation region 12, so that the high concentration region 14 is formed in a wider region including the defective region.

An electrode (not shown) connected commonly to the third regions 9 of the respective sensor portions 5 is provided on the sensor portion formation region 3. The third regions 9 of the respective sensor portions 5 are connected to a power source 23 via this electrode. The first region 2 and the third region 9 are kept at a reference potential by the power source 23. Thus, a reverse bias voltage can be applied to the first photodiode 24 (a PN junction between the first region 2 and the second region 8) and to the second photodiode 25 (a PN junction between the second region 8 and the third region 9). The thicknesses and impurity concentrations of the second region 8 and the third region 9 and the layout of the third region 9 are determined so that the second region 8 can generally completely be depleted when the predetermined reverse bias voltage is applied to the first and second photodiodes 24, 25.

When the amounts of the light received by the respective sensor portions 5 are determined by the image sensor 1, the predetermined reverse bias voltage is applied to the first and second photodiodes 24, 25 by the power source 23 to generally completely deplete the second regions 8.

When the sensor portions 5 are each irradiated with light, the first and second photodiodes 24, 25 generate photovoltaic power according to the amount of light received thereby, and a photoelectric current caused by the photovoltaic power flows from the second region 8 to the first and third regions 2, 9. At this time, the second region 8 is completely depleted, whereby the first and second photodiodes 24, 25 generate maximum photoelectric current, and have a minimum capacitance. That is, the sensor portions 5 each have a high sensitivity.

Since the fourth region 10 has a higher impurity concentration than the other portion of the third region 9, the depletion layer is prevented from spreading to the surface of the fourth region 10 when the reverse bias voltage is applied to the second photodiode 25. Even if the defective region is present in the vicinity of the surface of the third region 9, the depletion layer is prevented from spreading into the defective region. Therefore, no leak electric current occurs due to the defects. In other words, the impurity concentration of the fourth region 10 is set sufficiently high to prevent the depletion layer from spreading into the defective region adjacent to the surface of the third region 9 when the predetermined voltage is applied to the second photodiode 25.

Since the third region 9 contacts the high concentration region 14, the depletion layer spreads into the high concentration region 14 when the reverse bias voltage is applied to the second photodiode 25. However, the high concentration region 14 has a high impurity concentration, so that the depletion layer does not spread into the defective region adjacent to the isolation region 12. In other words, the impurity concentration of the high concentration region 14 is set sufficiently high to prevent the depletion layer from spreading into the defective region adjacent to the isolation region 12 when the predetermined voltage is applied to the second photodiode 25. Thus, the image sensor 1 is free from variations in electrical characteristics.

The N-channel MOS 6N includes a P-type well layer 15 provided on the first region 2, a pair of N-type source/drain regions 16 disposed in opposed spaced relation in a surface of the well layer 15, and a gate electrode 17 provided on the well layer 15 with the intervention of a gate insulation film not shown. The gate electrode 17 extends between the pair of source/drain regions 16.

When a predetermined voltage is applied between the pair of source/drain regions 16 with the gate electrode 17 kept at a predetermined potential, a channel is formed in the vicinity of the gate insulation film between the pair of source/drain regions 16 in the well layer 15. Thus, an electric current (drain current) flows along the channel.

The P-channel MOS 6P is disposed on an N-type region 18 formed on the first region 2 by epitaxial growth, and includes an N-type well layer 19 provided on the region 18, a pair of P-type source/drain regions 20 disposed in opposed spaced relation in a surface of the well layer 19, and a gate electrode 21 provided on the well layer 19 with the intervention of a gate insulation film not shown. The gate electrode 21 extends between the pair of source/drain regions 20.

When a predetermined voltage is applied between the pair of source/drain regions 20 with the gate electrode 21 kept at a predetermined potential, a channel is formed in the vicinity of the gate insulation film between the pair of source/drain regions 20 in the well layer 19. Thus, an electric current (drain current) flows along the channel.

A LOCOS isolation region 22 is provided between the source/drain regions 16, 20 of the N-channel MOS 6N and the P-channel MOS 6P disposed adjacent each other, whereby the N-channel MOS 6N and the P-channel MOS 6P are electrically isolated from each other.

FIGS. 2(a), 2(b) and 2(c) are schematic sectional views for explaining a production method for the image sensor 1 shown in FIG. 1.

An N-type first epitaxial layer 31 is formed on a first region 2 (e.g., on a P-type silicon substrate S) by epitaxial growth. Then, a P$^-$ type second epitaxial layer 32 is formed on the first epitaxial layer 31 by epitaxial growth as shown in FIG. 2(a).

The first and second epitaxial layers 31, 32 each have a lower impurity concentration than the well layers 13, 19 shown in FIG. 1. For example, the first epitaxial layer 31 has an impurity concentration of not higher than $1\times10^{15}$ cm$^{-3}$ (e.g., from $7\times10^{14}$ cm$^{-3}$ to $1\times10^{15}$ cm$^{-3}$).

The epitaxial growth makes it possible to precisely control the impurity concentrations of the first epitaxial layer 31 and the second epitaxial layer 32 at predetermined levels, and permits the first and second epitaxial layers 31, 32 to each have an exactly predetermined thickness.

Next, a P-type impurity is introduced into portions of the second epitaxial layer 32 corresponding to the high concentration regions 14 of the respective sensor portions 5 and portions of the second epitaxial layer 32 shallower than these portions. In turn, a P-type impurity is implanted into surface portions of the second epitaxial layer 32 corresponding to the well layers 15, 13, and an impurity for controlling an N-type conductivity is implanted into a surface portion of the second epitaxial layer 32 corresponding to the well layer 19. Thereafter, these impurities are simultaneously thermally diffused in the first and second epitaxial layers 31, 32, whereby the well layers 15, 13, 19 are formed.

The P-type impurity diffuses in the second epitaxial layer 32 and the first epitaxial layer 31 at a higher diffusion rate than the N-type impurity. When the P-type impurity reaches the first region 2, the N-type impurity does not reach the first region 2 yet. Therefore, the thermal diffusion (heating) is finished at this time point. Thus, a portion of the first epitaxial layer 31 remains as the N-type region 18 between the first region 2 and the well layer 19 as shown in FIG. 2(b).

The first and second epitaxial layers 31 and 32 in the sensor portion formation region 3 are respectively divided into a plurality of second regions 8 and a plurality of third regions 9 for the respective sensor portions 5 by the well layer 13.

Thereafter, surface portions of the well layers 15, 19 adjacent to an interface between the well layer 15 and the well layer 19 and a surface portion of the well layer 13 are selectively oxidized for formation of the isolation regions 22, 12 by a known LOCOS technique. The isolation region 12 has a greater width than the well layer 13. Portions of the second epitaxial layer 32 implanted with the P-type impurity below the isolation region 12 (on the side of the first region 2) each constitute the P$^+$-type high concentration region 14 as shown in FIG. 2(c).

Thereafter, the source/drain regions 20 and the fourth regions 10 for the respective sensor portions 5 are formed as shown in FIG. 1 by implantation and diffusion of a P-type impurity with the use of a mask having a predetermined opening pattern. With the use of a mask having a predetermined opening pattern, an N-type impurity is implanted and diffused into portions of the second epitaxial layer 32 excluding portions corresponding to the third regions 9 for the respective sensor portions 5 in the sensor portion formation region 3 of the image sensor 1 shown in FIG. 1. Thus, these portions of the second epitaxial layer 32 are each imparted with an N-type conductivity, and have an impurity concentration equivalent to that of the first epitaxial layer 31.

Further, the source/drain regions 16 and the fifth regions 11 for the respective sensor portions 5 are formed by implantation and diffusion of an N-type impurity with the use of a predetermined opening pattern. In each of the sensor portions 5, the third region 9 is constituted by the other portion of the second epitaxial layer 32 (to which neither the P-type impurity nor the N-type impurity are introduced after the formation of the second epitaxial layer 32) and the fourth region 10, and the second region 8 is constituted by a portion of the second epitaxial layer 32 between the third region 9 and the fifth region 11 and the other portion of the first epitaxial layer 31.

Thereafter, the gate insulation films and the gate electrodes 17, 21 are formed in predetermined portions of the functional device formation region 4. Thus, the image sensor 1 shown in FIG. 1 is provided.

As described above, the second region 8 and the third region 9 are formed by the epitaxial growth, so that the impurity concentrations of the second and third regions 8, 9 can easily be controlled.

In the production method for the image sensor 1, the P-type silicon substrate S per se serves as the first region 2. Hence, there is no need to form a buried layer in the silicon substrate S, thereby reducing the number of steps.

While the embodiment of the present invention has thus been described, the invention may be embodied in any other ways. For example, the first region 2 maybe a buried layer formed by forming the first epitaxial layer 31 on a silicon substrate containing a P-type impurity implanted into a predetermined portion thereof, and then thermally diffusing the impurity into the silicon substrate and the first epitaxial layer 31.

The semiconductor portions of the image sensor 1 may each have an opposite conductivity type. That is, the P-type portions in the aforesaid embodiments may each have an N conductivity type, and vice versa.

The isolation portion may include, instead of the well layer 13, a trench (deep trench) extending through the second and third regions 8, 9 (the first and second epitaxial layers 31, 32) to reach the first region 2 (the silicon substrate S). In this case, the deep trench has a depth which is greater than the total thickness of the second and third regions 8, 9 (the first and second epitaxial layers 31, 32). The deep trench may be filled with silicon oxide or polysilicon.

Even where the isolation region 12 is formed on such a deep trench, the electrical isolation between the sensor portion formation region 3 and the functional device formation region 4 and the electrical isolation between the respective sensor portions 5 can properly be achieved.

Although the number of steps is increased in these cases, the area of the isolation region can be reduced. Therefore, the sensor portions 5 can more densely be formed in the sensor portion formation region 3, so that the resolution of the image sensor can be improved.

While the present invention has been described in detail by way of the embodiment thereof, it should be understood that the foregoing disclosure is merely illustrative of the technical principles of the present invention but not limitative of the same. The spirit and scope of the present invention are to be limited only by the appended claims.

This application corresponds to Japanese Patent Application No. 2003-197965 filed with the Japanese Patent Office on Jul. 16, 2003, the disclosure thereof being incorporated herein by reference.

What is claimed is:

1. An image sensor comprising a plurality of sensor portions arranged on a semiconductor substrate,
   the sensor portions each comprising:
   a sensor surface;
   a first region of a first conductivity type defined in the semiconductor substrate;
   a second region of a second conductivity type formed on the first region by epitaxial growth, the second conductivity type being different from the first conductivity type;
   a third region of the first conductivity type formed on the second region by epitaxial growth; wherein the sensor surface, except for a center portion of the sensor surface, includes the third region; and
   a fourth region of the first conductivity type, comprised by the third region in a sensor surface portion of the third region, and having a higher impurity concentration than the other portion of the third region, the fourth region being provided in a surface portion of the third region corresponding to a region for receiving light in the image sensor;
   the sensor portions each including a first photodiode constituted by the first region and the second region and a second photodiode constituted by the second region and the third region.

2. The image sensor as set forth in claim 1, further comprising a well layer of the first conductivity type having a higher impurity concentration than the third region and disposed between the respective second and third regions of each adjacent pair of the sensor portions.

3. The image sensor as set forth in claim 2, further comprising an isolation region of an oxide provided on the well layer.

4. The image sensor as set forth in claim 1, further comprising a power source for applying a reverse bias voltage to the first and second photodiodes.

5. The image sensor as set forth in claim 1, further comprising a functional device provided in the semiconductor substrate.

6. The image sensor as set forth in claim 1, further comprising a CMOS provided in the semiconductor substrate.

7. The image sensor as set forth in claim 1, wherein the center portion of the sensor surface comprises the second region.

8. The image sensor as set forth in claim 1, wherein the center portion of the sensor surface comprises a fifth region of the second conductivity type.

9. The image sensor as set forth in claim 8, wherein the fifth region comprises an electrode take-out region for the first photodiode and second photodiode.

10. An image sensor comprising a plurality of sensor portions arranged on a semiconductor substrate,
    the sensor portions each comprising:
    a sensor surface;
    a first region of a first conductivity type defined in the semiconductor substrate;
    a second region of a second conductivity type formed on the first region by epitaxial growth, the second conductivity type being different from the first conductivity type; and
    a third region of the first conductivity type formed on the second region by epitaxial growth, and
    a fourth region of the first conductivity type, comprised by the third region in a surface portion of the third region, and having a higher impurity concentration than the other portion of the third region, the fourth region being provided in the sensor-surface portion of the third region corresponding to a region for receiving light in the image sensor;
    the sensor portions each including a first photodiode constituted by the first region and the second region and a second photodiode constituted by the second region and the third region,
    the image sensor further comprising:
    a well layer of the first conductivity type having a higher impurity concentration than the third region and disposed between the second and third regions of each adjacent pair of the sensor portions;
    an isolation region of an oxide provided on the well layer; and
    a high concentration region of the first conductivity type provided between the isolation region and the third region, the high concentration region having a higher impurity concentration than the third region so that a depletion layer does not spread into a defective region adjacent to the isolation region.

* * * * *